(12) United States Patent
Aqrawi et al.

(10) Patent No.: US 11,377,931 B2
(45) Date of Patent: Jul. 5, 2022

(54) MACHINE LEARNING TRAINING SET GENERATION

(71) Applicant: Schlumberger Technology Corporation, Sugar Land, TX (US)

(72) Inventors: Ahmed Adnan Aqrawi, Sandnes (NO); Nader Salman, Arlington, MA (US); Guido Johannes van der Hoff, Tananger (NO)

(73) Assignee: Schlumberger Technology Corporation, Sugar Land, TX (US)

( * ) Notice: Subject to any disclaimer, the term of this patent is extended or adjusted under 35 U.S.C. 154(b) by 356 days.

(21) Appl. No.: 16/324,109

(22) PCT Filed: Sep. 9, 2016

(86) PCT No.: PCT/US2016/050845
§ 371 (c)(1),
(2) Date: Feb. 7, 2019

(87) PCT Pub. No.: WO2018/031051
PCT Pub. Date: Feb. 15, 2018

(65) Prior Publication Data
US 2019/0169962 A1    Jun. 6, 2019

Related U.S. Application Data

(60) Provisional application No. 62/372,115, filed on Aug. 8, 2016.

(51) Int. Cl.
*E21B 43/00* (2006.01)
*G01V 1/50* (2006.01)
(Continued)

(52) U.S. Cl.
CPC .............. *E21B 43/00* (2013.01); *E21B 41/00* (2013.01); *E21B 47/00* (2013.01); *G01V 1/302* (2013.01);
(Continued)

(58) Field of Classification Search
CPC .......... E21B 43/00; E21B 47/00; E21B 41/00; E21B 2200/22; E21B 41/0092;
(Continued)

(56) References Cited

U.S. PATENT DOCUMENTS

| 10,614,373 B1* | 4/2020 | Jeffery ...................... G06N 5/04 |
| 2005/0171700 A1* | 8/2005 | Dean ....................... G01V 1/301 |
| | | 702/16 |

(Continued)

FOREIGN PATENT DOCUMENTS

| WO | 2013/188241 A2 | 12/2013 |
| WO | 2014/039036 A1 | 3/2014 |
| WO | 2018/072815 A1 | 4/2018 |

OTHER PUBLICATIONS

Oliver Obst, et al., "Taming the Reservoir: Feedforward Training for Recurrent Neural Networks," WCCI 2012 IEEE World Congress on Computational Intelligence, pp. 1-7 (Year: 2012).*

(Continued)

*Primary Examiner* — Steven W Crabb
(74) *Attorney, Agent, or Firm* — Christopher M. Mooney

(57) ABSTRACT

Systems, computer-readable media, and methods for generating machine learning training data by obtaining reservoir data, determining subsections of the reservoir data, labeling the subsections of the reservoir data to generate labeled reservoir data, and feeding the labeled reservoir data into an artificial neural network. The reservoir data can be labeled using analysis data or based on interpretive input from an interpreter.

20 Claims, 9 Drawing Sheets

(51) Int. Cl.
  *E21B 47/00* (2012.01)
  *E21B 41/00* (2006.01)
  *G01V 1/30* (2006.01)
  *G06K 9/62* (2022.01)
  *G06N 3/04* (2006.01)
  *G01V 11/00* (2006.01)
  *G06F 30/20* (2020.01)

(52) U.S. Cl.
  CPC ................ *G01V 1/50* (2013.01); *G06F 30/20* (2020.01); *G06K 9/6256* (2013.01); *G06N 3/04* (2013.01); *E21B 2200/22* (2020.05); *G01V 1/307* (2013.01); *G01V 11/00* (2013.01); *G01V 2210/63* (2013.01)

(58) Field of Classification Search
  CPC .... E21B 41/0099; E21B 47/006; E21B 33/00; G06F 30/20; G06F 30/25; G06F 30/27; G06F 30/28; G06F 2111/00; G06F 2119/22; G01V 1/302; G01V 1/50; G01V 2210/63; G01V 11/00; G01V 1/307; G06K 9/6256; G06N 3/04; G06V 10/774; G06V 30/19147
  See application file for complete search history.

(56) References Cited

U.S. PATENT DOCUMENTS

| | | |
|---|---|---|
| 2007/0016389 A1 | 1/2007 | Ozgen |
| 2008/0071708 A1 | 3/2008 | Rozita et al. |
| 2010/0211536 A1 | 8/2010 | Al-Fattah |
| 2012/0025997 A1 | 2/2012 | Yintao et al. |
| 2012/0090834 A1* | 4/2012 | Imhof .................... G01V 1/307 166/250.01 |
| 2013/0096898 A1 | 4/2013 | Usadi et al. |
| 2014/0188769 A1* | 7/2014 | Lim .................. G06F 16/24578 706/12 |
| 2014/0351183 A1 | 11/2014 | Germain et al. |
| 2016/0195637 A1* | 7/2016 | Honarpour ........... G01N 23/046 378/5 |
| 2016/0313463 A1* | 10/2016 | Wahrmund .............. G01V 1/30 |
| 2017/0017899 A1* | 1/2017 | Maor .................. G06F 16/2456 |

OTHER PUBLICATIONS

Extended Search Report for the counterpart European patent application 16912864.2 dated Feb. 26, 2020.
International Search Report and Written Opinion for the equivalent International patent application PCT/US2016/050845 dated May 1, 2017.
International Preliminary Report on Patentability for the equivalent International patent application PCT/US2016/050845 dated Feb. 21, 2019.

* cited by examiner

MACHINE LEARNING TRAINING SET GENERATION

CROSS-REFERENCE TO RELATED APPLICATION

The present document is based on and claims priority to U.S. Provisional Application Ser. No. 62/372,115, filed Aug. 8, 2016, which is incorporated herein by reference in its entirety.

BACKGROUND

Workers in various organizations utilize and often rely on software systems to perform their work. For example, in the oil and gas industry, an exploration and production sector (E&P) software system allows users to interpret seismic data, perform well correlation, build reservoir models suitable for simulation, submit and visualize simulation results, calculate volumes, produce maps, and design development strategies to maximize reservoir exploitation.

Many industries have begun using machine learning techniques in software systems to perform various tasks without having to explicitly program a system to do so. For example, machine learning has been used in self-driving vehicles, speech recognition, and internet search engines.

In order to use machine learning algorithms, the algorithms build models from training sets of input labeled data (e.g., previously analyzed, classified, and/or formatted data). Thus, the machine learning algorithms can make use of pattern recognition to match patterns in new data to generated models to, for example, classify the new data, make predictions based on the new data, and/or make decisions based on the new data.

E&P software systems may operate with large amounts of data, and fast and efficient processes for analyzing the data automatically can greatly benefit the oil and gas industry. However, the data generally is not in a form that can be used by a machine learning algorithm. For example, the data is not interpreted, not labeled, not sufficiently labeled, incorrectly labeled, not formatted for a machine learning algorithm, etc.

SUMMARY

Systems, apparatus, computer-readable media, and methods are disclosed, of which the methods include generating machine learning training data by obtaining reservoir data, determining subsections of the reservoir data, labeling the subsections of the reservoir data to generate labeled reservoir data, and feeding the labeled reservoir data into an artificial neural network.

In some embodiments, the reservoir data can include analysis data, and labeling the subsections of the reservoir data can include labeling the subsections of the reservoir data based on the analysis data, the methods can further include performing quality control on the labeled reservoir data using at least one of input from an interpreter or a machine learning process.

In additional embodiments, the analysis data can be metadata incorporated with the reservoir data.

In further embodiments, the methods can include presenting visualizations of the subsections to an interpreter and receiving interpretive input corresponding to the subsections, where labeling the subsections of the reservoir data includes labeling the subsections of the reservoir data based on the interpretive input.

In some embodiments, the artificial neural network can be used for one or more of interpreting seismic data, interpreting geophysical data, interpreting reservoir data, performing well correlations, building reservoir models suitable for simulation, generating visualizations of simulation results, calculating volumes, producing maps, or designing development strategies to maximize reservoir exploitation.

In additional embodiments, the reservoir data can include a well log, and the subsections of the reservoir data can include line segments corresponding to the well log.

In further embodiments, the reservoir data can include an image, and the subsections of the reservoir data can include rectangular subsections of the image.

In some embodiments, the reservoir data can include a reservoir model, and the subsections of the reservoir data can include voxels of the reservoir model.

In additional embodiments, the reservoir data can include a simulated reservoir model, and the subsections of the reservoir data can include sequences of voxels of the simulated reservoir model.

In further embodiments, the labeled reservoir data can include at least one of text labels, binary labels, or n-tuple labels corresponding to the subsections.

Systems and apparatus are also disclosed that include a processor and a memory system with non-transitory, computer-readable media storing instructions that, when executed by the processor, causes the systems and apparatus to perform operations that include generating machine learning training data by obtaining reservoir data, determining subsections of the reservoir data, labeling the subsections of the reservoir data to generate labeled reservoir data, and feeding the labeled reservoir data into an artificial neural network.

Non-transitory, computer-readable media are also disclosed that store instructions that, when executed by a processor of a computing system, cause the computing system to perform operations that include generating machine learning training data by obtaining reservoir data, determining subsections of the reservoir data, labeling the subsections of the reservoir data to generate labeled reservoir data, and feeding the labeled reservoir data into an artificial neural network.

The foregoing summary is intended merely to introduce a subset of the aspects of the present disclosure, and is not intended to be exhaustive or in any way identify any particular elements as being more relevant than any others. This summary, therefore, should not be considered limiting on the present disclosure or the appended claims.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures.

DETAILED DESCRIPTION

Reference will now be made in detail to embodiments, examples of which are illustrated in the accompanying drawings and figures. In the following detailed description, numerous specific details are set forth in order to provide a thorough understanding of the disclosure. However, it will be apparent to one of ordinary skill in the art that certain embodiments of the disclosure may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are used to distinguish one element from another. For example, a first object or step could be termed a second object or step, and, similarly, a second object or step could be termed a first object or step, without departing from the scope of the disclosure. The first object or step, and the second object or step, are both, objects or steps, respectively, but they are not to be considered the same object or step.

The terminology used in the description herein is for the purpose of describing particular embodiments and is not intended to be limiting. As used in the description and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

Attention is now directed to processing procedures, methods, techniques, and workflows that are in accordance with some embodiments. Some operations in the processing procedures, methods, techniques, and workflows disclosed herein may be combined and/or the order of some operations may be changed.

Figure 1:
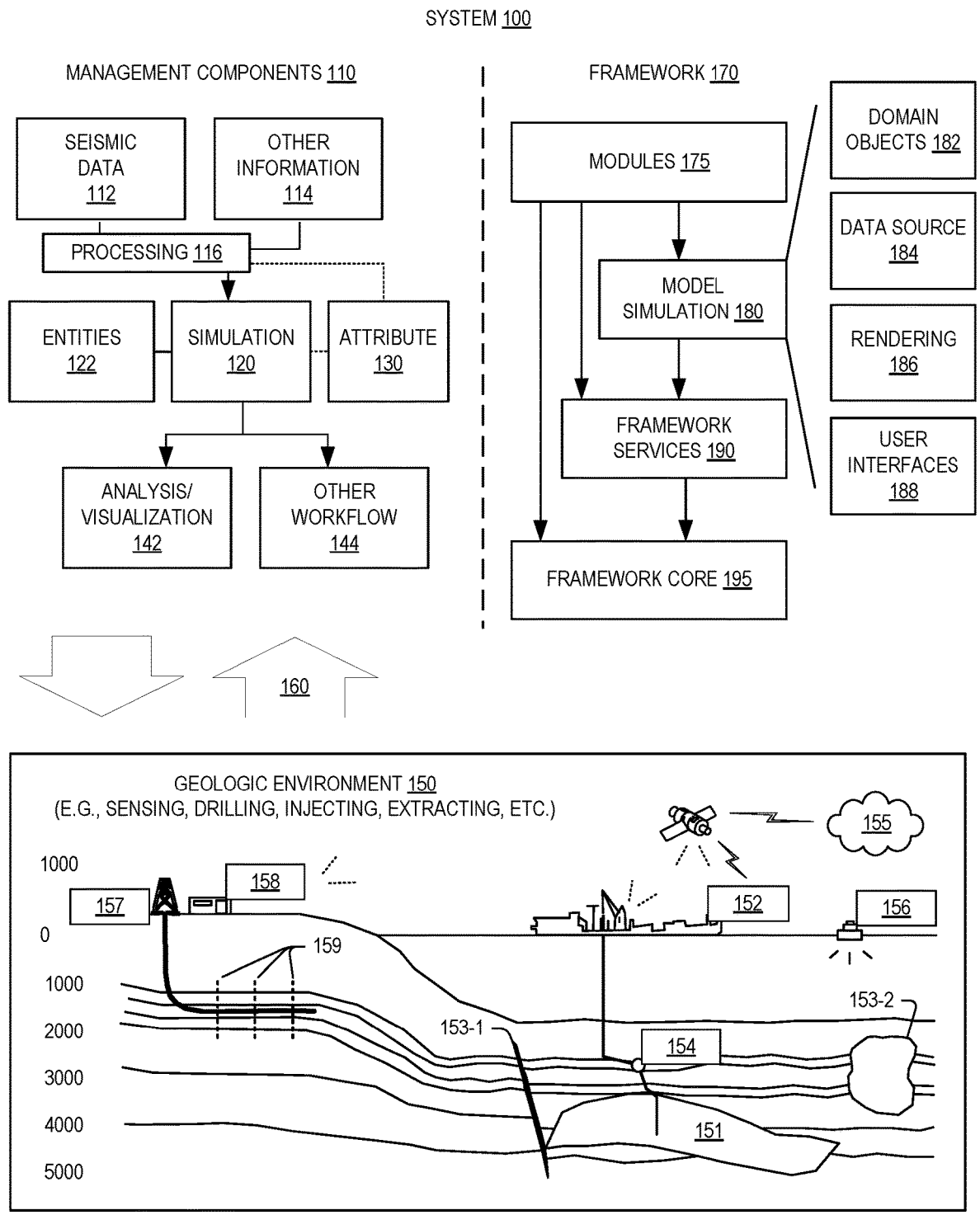
FIG. 1 illustrates an example of a system that includes various management components to manage various aspects of a geologic environment, according to an embodiment.

FIG. 1 illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142, and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT® .NET® framework (Redmond, Wash.), which provides a set of extensible object classes. In the .NET® framework, an object class encapsulates a module of reusable code and associated data structures. Object classes can be used to instantiate object instances for use by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Tex.), the INTERSECT™ reservoir simulator (Schlumberger Limited, Houston Tex.), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Tex.) allows for integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may also include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a workstep may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

In some embodiments, system 100 may include an E&P software system that generates training data sets that can be used with machine learning processes to develop machine learning models. The machine learning models can subsequently be used for faster and more efficient processes of, for example, automatically interpreting seismic data, interpreting geophysical data, interpreting reservoir data, performing well correlation, building reservoir models suitable for simulation, generating visualizations of simulation results, calculating volumes, producing maps, and/or designing development strategies to maximize reservoir exploitation.

Figure 2:
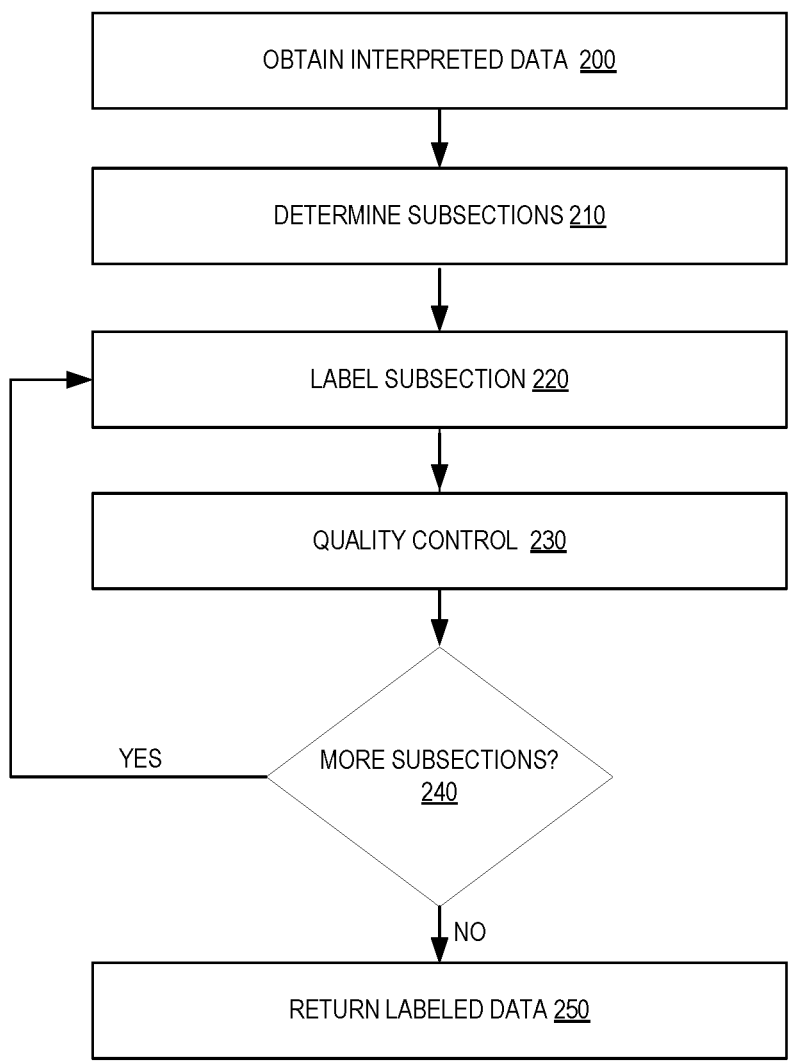
FIG. 2 illustrates an example of a method for generating machine learning training data sets using interpreted data, according to an embodiment.

FIG. 2 illustrates an example of a method for generating machine learning training data sets using interpreted data, according to an embodiment. In various embodiments, the training data can be used to automate data analysis and interpretation, reservoir simulation, map generation, etc., in an E&P software system, Thus, the training data can be used in various processes to, for example, maximize reservoir exploitation. In some embodiments, the example method illustrated in FIG. 2 can be performed using a computing device that includes the framework (e.g., framework 170) and the management components (e.g., management components 110) described above with reference to FIG. 1. In further embodiments, the example method illustrated in FIG. 2 can be performed by a crawler application that searches through, obtains, and/or analyzes data (e.g., from archives, databases, local storage, remote sources, etc.).

The example method can begin in 200 when the computing device obtains interpreted data. In some embodiments, the interpreted data can be received from a remote device, while, in other embodiments, the interpreted data can be obtained from local storage on the computing device.

In various embodiments, the interpreted data can be reservoir data such as, for example, seismic data, geophysical data, well data, models, visualizations, simulations, maps, images, videos, charts, graphs, etc. that correspond to one or more reservoirs.

In some implementations, the interpreted data can be, for example, one-dimensional data, such as, for example, well logs (e.g., as raw data and/or wirelines), etc.

In further implementations, the interpreted data can be, for example, two-dimensional data, such as, for example, images, videos, charts, graphs (e.g., frequency-wavenumber plots ("f-k plots")), etc.

In additional implementations, the interpreted data can be, for example, three-dimensional data, such as, for example, images, videos, charts, graphs, seismic cubes, reservoir models, etc.

In other implementations, the interpreted data can be, for example, four-dimensional data, such as, for example, videos, charts, graphs, simulated reservoir models, etc.

In some embodiments, the interpreted data can include analysis data. The analysis data can represent the result of an analysis of the data by an interpreter, by a machine learning process, etc. For example, a well log can include analysis data from an interpreter that identifies types of geological material associated with subsets of the data.

The analysis data can be included with the interpreted data in, for example, a separate data sheet, metadata incorporated with the interpreted data, etc.

In 210, the computing device can determine subsections of the interpreted data. For example, a wireline of a well log can be segmented into line segments or areas of interest, a two-dimensional image can be segmented into rectangular subsections of the image (e.g., in pixels), a three-dimensional reservoir model can be segmented into voxels, and a simulated reservoir model can be segmented into a sequence of voxels. As used herein, a voxel can represent a three-dimensional discrete subsection of a three-dimensional object. However, a voxel is not limited to any particular size, and can represent a smallest addressable subsection of a three-dimensional object, or a collection of multiple smallest addressable subsections of a three-dimensional object.

Thus, the interpreted data can be represented as a sequence of subsections, which can be processed incrementally. For example, the first subsection of a wireline can be the first meter under the surface and the last subsection can be the bottom of a well. As an additional example, the first subsection of an image can be the pixel in the top-left corner, and the last subsection can be the pixel in the bottom-right corner. As a further example, the first subsection of a three-dimensional reservoir model can be the voxel in the top-front-left corner, and the last subsection can be the voxel in the bottom-back-right corner.

In various embodiments, the computing device can process each subsection in incremental iterations of 220-240, starting with the first subsection.

In 220, the computing device can label a subsection of the interpreted data (e.g., the first subsection on the first iteration of 220). The computing device can process the analysis data and determine whether there is a relevant analysis associated with the subsection. In some embodiments, the computing device can search for various objects (e.g., features, structures, etc.), types of analysis, etc. In further embodiments, the computing device can search for specific objects, types of analysis, etc. For example, the computing device can search for specific features that were previously identified by a user.

In some implementations, the computing device, using the analysis data, may search for analyses identifying rock types in the subsection, faults in the subsection, channels in the subsection, salt bodies in the subsection, a horizon in the subsection, etc. Thus, the computing device can classify the subsection (e.g., the subsection is associated with a fault). In other implementations, the computing device can classify the subsection and localize the classification object within the subsection based on location information in the analysis data. For example, the computing device can identify xy or xyz coordinates of a bounding box associated with the object within the subjection. In still further implementations, the computing device can detect and classify multiple objects within a subsection. In additional implementations, the computing device can segment the subsection based on multiple objects detected within the subsection. For example, the computing device can identify ranges of xy or xyz coordinates associated with each identified object within the subsection.

In some embodiments, the analysis data can be associated with position data in the interpreted data. For example, a well log may specify that meters 0-7.3 are identified as sandstone, meters 10.2-11.3 are identified as water, etc. Two-dimensional, three-dimensional, and four-dimensional data may include xy coordinates, xyz coordinates, and/or timestamps associated with identified features, structures, etc. of the data.

Thus, the computing device can determine whether the analysis data identifies a feature or structure in the subsection and can label the data accordingly.

In some embodiments, the computing device can label the subsection using text labels. For example, if a fault is identified, the computing device can associate the subsection with the text label "fault."

In further embodiments, the computing device can label the subsection using a binary label. For example, if the computing device is specifically searching for faults in the subsection, the computing device can associate a binary value of 0 if no fault is identified in the subsection and a binary value of 1 if a fault is identified in the subsection. In additional embodiments, labels of other base values can be used (e.g., 8, 10, 16, etc.).

In still further embodiments, the computing device can label the subsection using an n-tuple label. The n-tuple label can be, for example, a concatenation of two or more labels. For example, if two or more structures are identified in a subsection, then the computing device can generate a label corresponding to each structure and concatenate the labels into an n-tuple label for the subsection. As a further example, an n-tuple label can be an array of binary values, with different positions in the array associated with different features or structures, and the binary values can be set based on whether a feature or structure associated with an array position is identified in the subsection. The n-tuple label can also be, for example, an array of other base values (e.g., 8, 10, 16, etc.), text strings, etc. As an example, an n-tuple label can be an array of integers with a first position in the array associated with an identified type of rock in the subsection (e.g., 0 equals unknown, 1 equals a first type, 2 equals a second type, etc.), and a second position in the array associated with an identified type of fault in the subsection.

In 230, the computing device can perform quality control on the labeled subsection. In some embodiments, quality control can be performed by an interpreter. Accordingly, a visualization of the subsection and the label can be presented, and the interpreter can indicate whether the label is accurate. In further embodiments, quality control can be performed by the computing device. For example, the crawler application can include a machine learning algorithm and/or can have access to a machine learning algorithm. Accordingly, the crawler application can compare the subsection and the label to one or more computer learning models, and determine whether the label is accurate, a value corresponding to a predicted likelihood that the label is accurate, etc. based on the one or more models.

If the label is determined to be inaccurate (e.g., the value corresponding to the predicted likelihood does not exceed a threshold or the interpreter indicates it is inaccurate), the label can be rejected, sent back to an interpreter, relabeled by the crawler, etc. If the label is determined to be accurate, the process can proceed to 240.

In some embodiments, the computing device can perform 230 on each iteration. In other embodiments, the computing device can perform a spot check by performing quality control 230 on a subgroup of subsections. Accordingly, in such embodiments, quality control 230 may not be performed on each iteration.

In 240, the computing device can determine if there are more subsections to process. For example, if the subsection labeled in 220 was the first subsection, the computing device can determine that there are more subsections to process and return to 220 (240, YES) to label the next subsection and perform quality control 230 on the next subsection. If the current subsection is the last subsection (240, NO), the process can proceed to 250.

In 250, the computing device can return the labeled data. In some embodiments, the computing device may return and/or feed the labeled data to a machine learning algorithm, located on the computing device, that uses the labeled data as a training data set to train machine learning models. In other embodiments, the computing device may return and/or feed the labeled data to a different device that utilizes the labeled data to train machine learning models.

As an example, the machine learning algorithm can be a feed-forward artificial neural network, such as a convolutional neural network. Additionally, the machine learning algorithm can use the trained models to label new data. Accordingly, large amounts of data (e.g., well logs, f-k plots, reservoir models, etc.) can be automatically analyzed in a manner that is faster and more efficient than previous processes. The analyzed data can be used to, for example, maximize reservoir exploitation.

Figure 3:
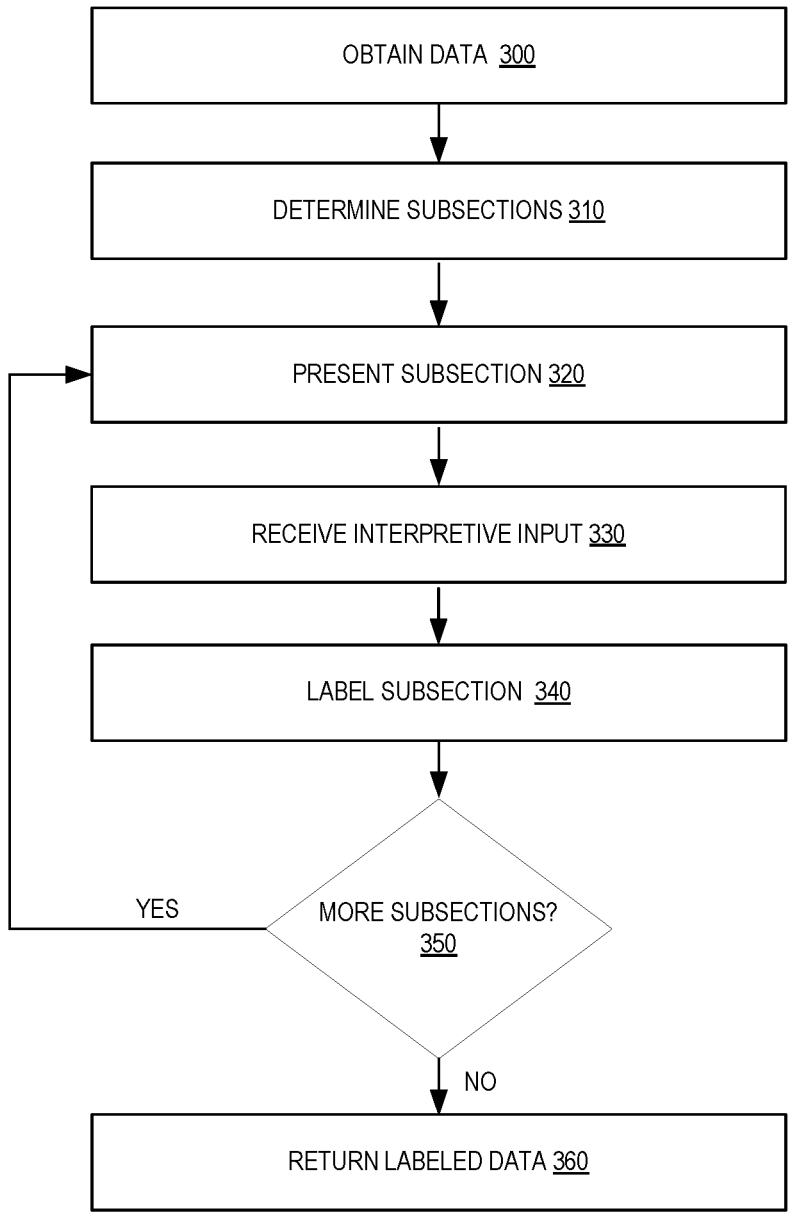
FIG. 3 illustrates an example of a method for generating machine learning training data sets in real time, according to an embodiment.

FIG. 3 illustrates an example of a method for generating machine learning training data sets in real time, according to an embodiment. In various embodiments, the training data can be used to automate data analysis and interpretation, reservoir simulation, map generation, etc., in an E&P software system. Thus, the training data can be used to, for example, maximize reservoir exploitation. In some embodiments, the example method illustrated in FIG. 3 can be performed using a computing device that includes the framework (e.g., framework 170) and the management components (e.g., management components 110) described above with reference to FIG. 1. In further embodiments, the example method illustrated in FIG. 3 can be performed by a crawler application that searches through, obtains, and/or analyzes data (e.g., from archives, databases, local storage, remote sources, etc.).

The example method can begin in 300 when the computing device obtains data. In some embodiments, the data can be received from a remote device, while, in other embodiments, the data can be obtained from local storage on the computing device.

In various embodiments, the data can be reservoir data, as discussed above.

In some implementations, the data can be, for example, one-dimensional data, two-dimensional data, three-dimensional data, and/or four-dimensional data, as discussed above with regard to FIG. 2.

In some embodiments, unlike the interpreted data used in FIG. 2, the data may not include analysis data In 310, the computing device can determine subsections of the data, e.g. as discussed above in 210 of FIG. 2. Thus, the data can be represented as a sequence of subsections, which can be processed incrementally, as discussed above with regard to FIG. 2.

In various embodiments, the computing device can process each subsection in incremental iterations of 320-350, starting with the first subsection.

In 320, the computing device can present a visualization of a subsection. In various embodiments, the visualization can be, for example, a chart, a graph, an image, a video, a three-dimensional model, a four-dimensional model, etc. In some embodiments, the computing device can additionally include an inquiry in the visualization. For example, the inquiry can include textual data that asks a specific question about the subsection. Example questions include: "Does the visualization show a fault?" "What type of rock corresponds to the data?" "Is water present in the visualization?" In further embodiments, the computing device can also include a graphical control element in the visualization. For example, the graphical control element can be a text box, a radio button, a check box, a slider, a list box, a drop-down list, etc.

In 330, the computing device can receive interpretive input from an interpreter. For example, the visualization can include a graphical control element, and the interpreter can transmit the input using the graphical control element. In some implementations, the interpretive input can be a classification of the subsection. In other implementations, the interpretive input can be a classification and a localization of the object within the subsection. In still further implementations, the interpretive input can be multiple classified objects within a subsection. In additional implementations, the interpretive input can be ranges of coordinates associated with multiple identified object within the subsection.

In 340, the computing device can label the subsection based on the interpretive input. The label can be, for example, a text label, a binary label, an n-tuple label, etc., as discussed above with regard to FIG. 2, and can correspond to the interpretive input received from the interpreter.

In 350, the computing device can determine if there are more subsections to process. For example, if the subsection labeled in 320 was the first subsection, the computing device can determine that there are more subsections to process and return to 320 (350, YES) to present the next subsection, receive interpretive input in 330, and label the next subsection in 340. If the current subsection is the last subsection (350, NO), the process can proceed to 360.

In 360, the computing device can return the labeled data, as discussed above with regard to FIG. 2.

Figure 4:
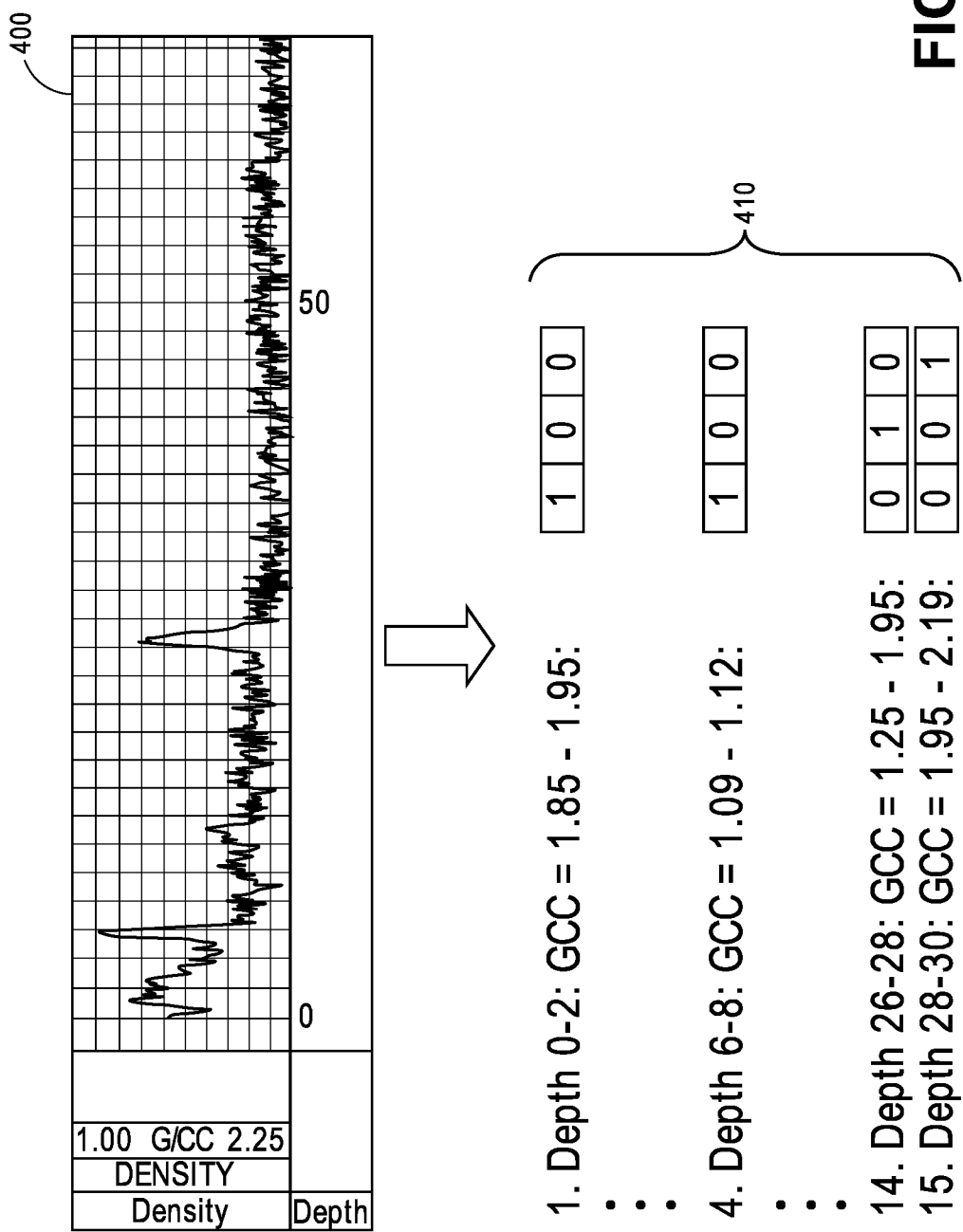
FIG. 4 illustrates an example of one-dimensional data that can be converted into machine learning training data sets, according to an embodiment.

FIG. 4 illustrates an example of one-dimensional data that can be converted into machine learning training data sets, according to an embodiment. As shown in FIG. 4, the one-dimensional data can be wireline 400 of a well log. Wireline 400 can show, for example, the measured bulk densities (in grams per cubic centimeter (GCC)) at various depths of a well. The measured bulk densities can be connected to form a single continuous line.

In some embodiments, wireline 400 can be in data that is obtained by the computing device in 300, described above. In further embodiments, wireline 400 can include analysis data, indicating, for example, types of rock that corresponds to the measured bulk densities at different depths within the well. Accordingly, wireline 400 and the analysis data can be in data that is obtained by the computing device in 200, described above.

In various embodiments, subsections of wireline 400 can be determined (e.g., as in 210 or 310). For example, wireline 400 can be split into line segments corresponding to equal vertical distances of the depths (e.g., 0-2 meters below the surface is a first subsection, 2-4 meters below the surface is a second subsection, etc.). Then, the subsections can be labeled (e.g., as in 220-230 or 320-340). Accordingly, labeled data 410 can be generated.

Labeled data 410 depicts subsection 1 (0-2 meters), subsection 4 (6-8 meters), subsection 14 (26-28 meters), and subsection 15 (28-30 meters).

Subsection 1 is associated with a bulk density between 1.85 and 1.95 GCC and a n-tuple label with the first position set as the binary value 1. Accordingly, the n-tuple label can indicate that a first type of rock is associated with subsection 1. Thus, subsection 1 can be classified based on the first type of rock.

Subsection 4 is associated with a bulk density between 1.09 and 1.12 GCC and a n-tuple label with the first position set as the binary value 1. Accordingly, the n-tuple label can indicate that the first type of rock is also associated with subsection 4. Thus, subsection 4 can be classified based on the first type of rock.

Subsection 14 is associated with a bulk density between 1.25 and 1.95 GCC and a n-tuple label with the second position set as the binary value 1. Accordingly, the n-tuple label can indicate that a second type of rock is associated with subsection 14. Thus, subsection 14 can be classified based on the second type of rock.

Subsection 15 is associated with a bulk density between 1.95 and 2.19 GCC and a n-tuple label with the third position set as the binary value 1. Accordingly, the n-tuple label can indicate that a third type of rock is associated with subsection 15. Thus, subsection 15 can be classified based on the third type of rock.

In various embodiments, labeled data 410 can be used as part of a training data set to train a machine learning model.

Figure 5:
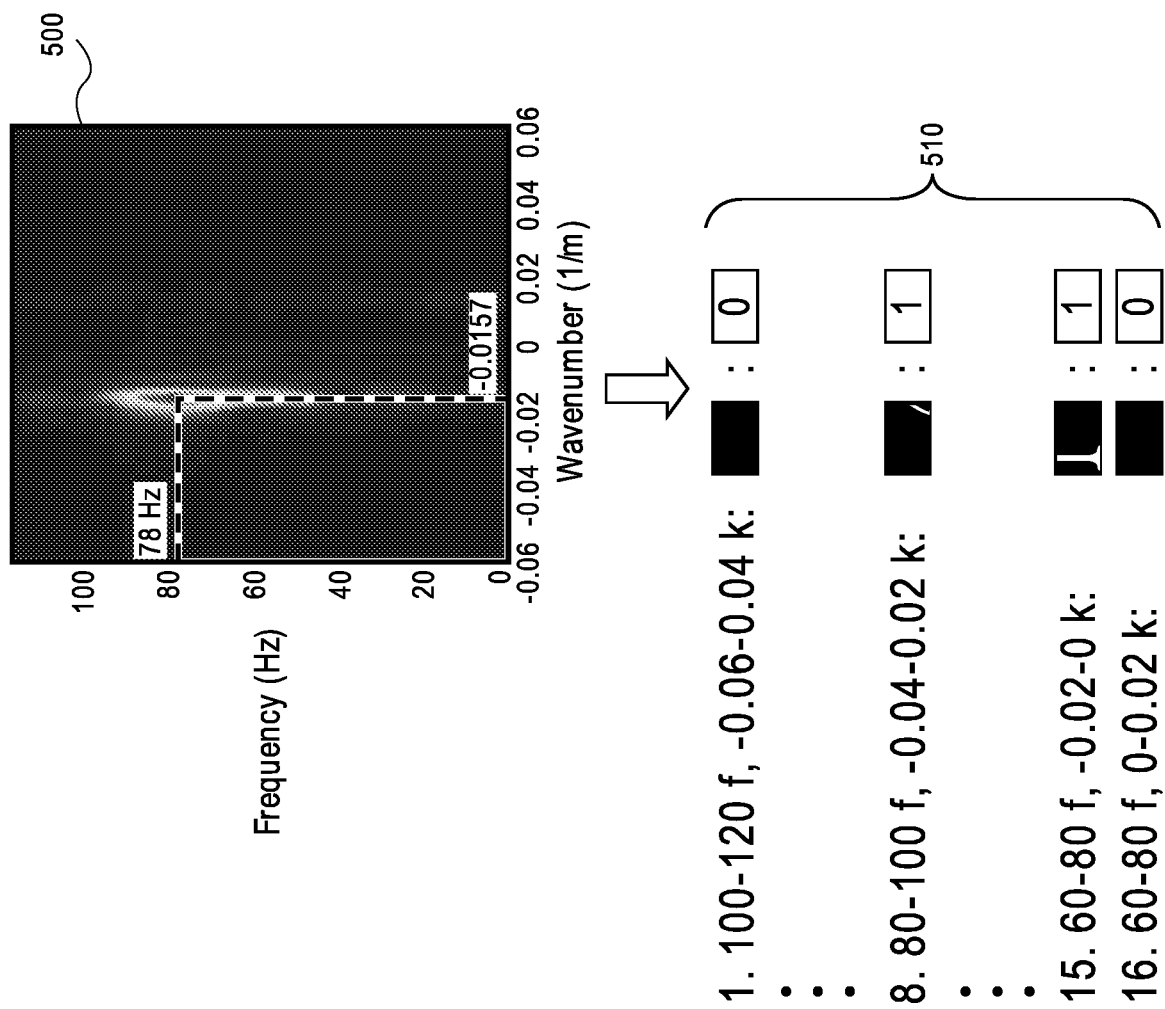
FIG. 5 illustrates an example of two-dimensional data that can be converted into machine learning training data sets, according to an embodiment.

FIG. 5 illustrates an example of two-dimensional data that can be converted into machine learning training data sets, according to an embodiment. As shown in FIG. 5, the two-dimensional data can be f-k plot 500 of a well log. F-k plot 500 can show, for example, wave energy data, and can be used to determine fracture spacing. In various embodiments, f-k plot 500 can be an image.

In some embodiments, f-k plot 500 can be in data that is obtained by the computing device in 300, described above. In further embodiments, f-k plot 500 can include analysis data, indicating, for example, what values correspond to the wave energy in the spectrum. Accordingly, f-k plot 500 and the analysis data can be in data that is obtained by the computing device in 200, described above.

In various embodiments, subsections of f-k plot 500 can be determined (e.g., as in 210 or 310). For example, f-k plot 500 can be separated into two-dimensional images, with a height corresponding to a frequency range and a width corresponding to a wavenumber range. Then, the subsections can be labeled (e.g., as in 220-230 or 320-340). Accordingly, labeled data 510 can be generated.

Labeled data 510 depicts subsection 1 (100 to 120 f, −0.06 to −0.04 k), subsection 8 (80 to 100 f, −0.04 to −0.02 k), subsection 15 (60 to 80 f, −0.02 to 0.00 k), and subsection 16 (60 to 80 f, 0.00 to 0.02 k).

Subsection 1 is associated with a solid color image and a binary label set as the binary value 0. Accordingly, the binary label can indicate that no wave energy data is associated with subsection 1.

Subsection 8 is associated with a solid color image with a white segment in the bottom right corner and a binary label set as the binary value 1. Accordingly, the binary label can indicate that wave energy data is associated with subsection 8. Thus, subsection 8 can be classified as showing wave energy data.

Subsection 15 is associated with a solid color image with a white strip segment on the left side and a binary label set as the binary value 1. Accordingly, the binary label can indicate that wave energy data is associated with subsection 15. Thus, subsection 15 can be classified as showing wave energy data.

Subsection 16 is associated with a solid color image and a binary label set as the binary value 0. Accordingly, the binary label can indicate that no wave energy data is associated with subsection 16.

In various embodiments, labeled data 510 can be used as part of a training data set to train a machine learning model.

Figure 6:
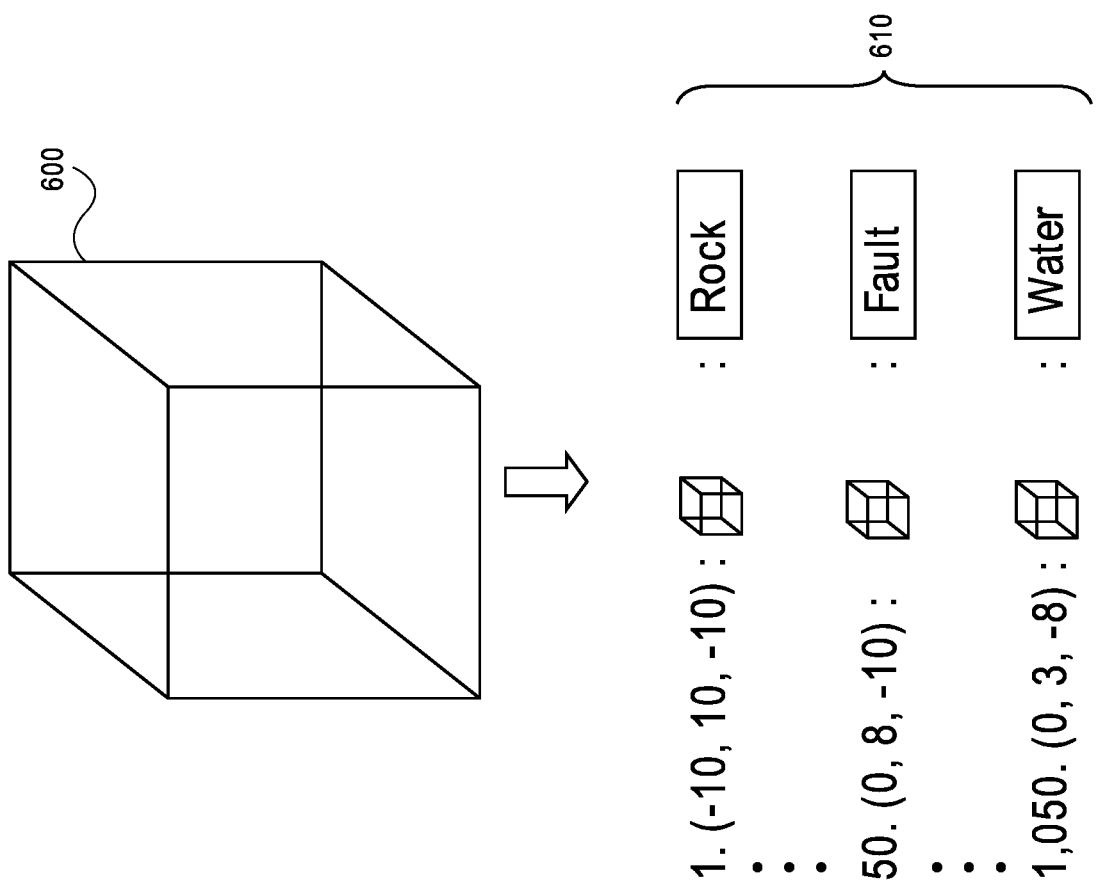
FIG. 6 illustrates an example of three-dimensional data that can be converted into machine learning training data sets, according to an embodiment.

FIG. 6 illustrates an example of three-dimensional data that can be converted into machine learning training data sets, according to an embodiment. As shown in FIG. 6, the three-dimensional data can represent, for example, reservoir model 600. Reservoir model 600 can visualize or otherwise include reservoir data, such as, for example, rock porosity, permeability, water saturation, etc.

In some embodiments, reservoir model 600 can be in data that is obtained by the computing device in 300, described above. In further embodiments, reservoir model 600 can include analysis data, indicating, for example, positions of geological features within the reservoir model. Accordingly, reservoir model 600 and the analysis data can be in data that is obtained by the computing device in 200, described above.

In various embodiments, subsections of reservoir model 600 can be determined (e.g., as in 210 or 310). For example, reservoir model 600 can be split into three-dimensional voxels of equal size. Then, the subsections can be labeled (e.g., as in 220-230 or 320-340). Accordingly, labeled data 610 can be generated.

Labeled data 610 depicts subsection 1 (center at –10 meters, 10 meters, –10 meters (x,y,z)), subsection 50 (center at 0 meters, 8 meters, –10 meters (x,y,z)), and subsection 1,050 (center at 0 meters, 3 meters, –8 meters (x,y,z)).

Subsection 1 is associated with a voxel in a position that includes mostly rock and no other geological features and a text label set as "rock." Thus, subsection 1 can be classified as showing rock.

Subsection 50 is associated with a voxel in a position that includes a fault that intersects the voxel and a text label set as "fault." Thus, subsection 50 can be classified as a fault.

Subsection 1,050 is associated with a voxel in a position that includes underground water that intersects the voxel and a text label set as "water." Thus, subsection 1,050 can be classified as showing water.

In various embodiments, labeled data 610 can be used as part of a training data set to train a machine learning model.

Figure 7:
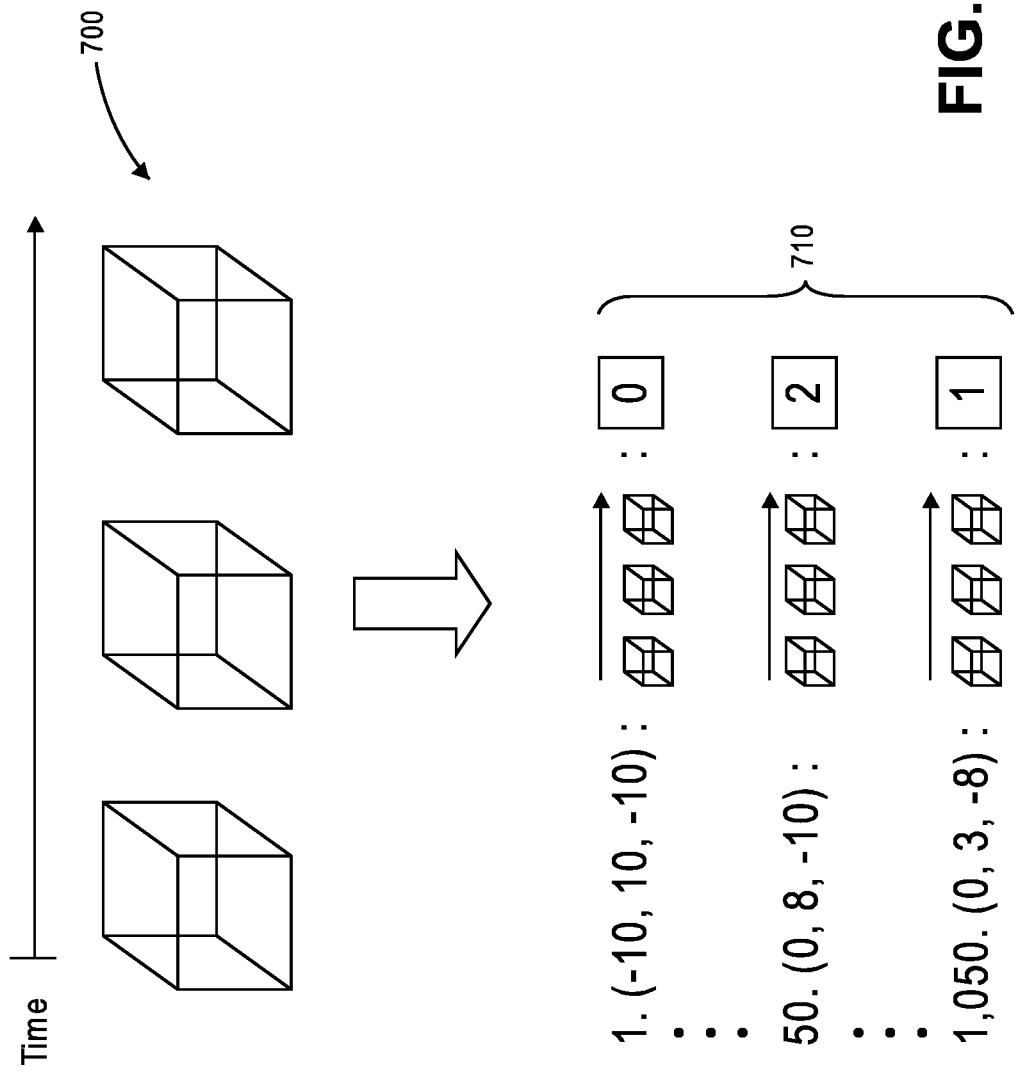
FIG. 7 illustrates an example of four-dimensional data that can be converted into machine learning training data sets, according to an embodiment.

FIG. 7 illustrates an example of four-dimensional data that can be converted into machine learning training data sets, according to an embodiment. As shown in FIG. 7, the four-dimensional data can represent, for example, simulated reservoir model 700. Simulated reservoir model 700 can visualize or otherwise include reservoir data, such as, for example, rock porosity, permeability, water saturation, etc. Additionally, simulated reservoir model 700 can visualize or otherwise show a simulation of a reservoir over time.

In some embodiments, simulated reservoir model 700 can be in data that is obtained by the computing device in 300, described above. In further embodiments, simulated reservoir model 700 can include analysis data, indicating, for example, positions of geological features, positions of fluids, etc. within the reservoir model. Accordingly, simulated reservoir model 700 and the analysis data can be in data that is obtained by the computing device in 200, described above.

In various embodiments, subsections of simulated reservoir model 700 can be determined (e.g., as in 210 or 310). For example, simulated reservoir model 700 can be split into four-dimensional voxels of equal size. Then, the subsections can be labeled (e.g., as in 220-230 or 320-340). Accordingly, labeled data 710 can be generated.

Labeled data 710 depicts subsection 1 (center at –10 meters, 10 meters, –10 meters (x,y,z)), subsection 50 (center at 0 meters, 8 meters, –10 meters (x,y,z)), and subsection 1,050 (center at 0 meters, 3 meters, –8 meters (x,y,z)). The subsections can indicate and/or visualize values of properties within the subsection, including any changes over time.

Subsection 1 is associated with a voxel in a position that may not have notable properties and/or features that are being analyzed. Accordingly, the integer label can indicate a value of 0.

Subsection 50 is associated with a voxel in a position that may show or indicate a second property and/or feature. Accordingly, the integer label can indicate a value of 2.

Subsection 1,050 is associated with a voxel in a position that may show or indicate a first property and/or feature. Accordingly, the integer label can indicate a value of 1.

In various embodiments, labeled data 710 can be used as part of a training data set to train a machine learning model.

Figure 8:
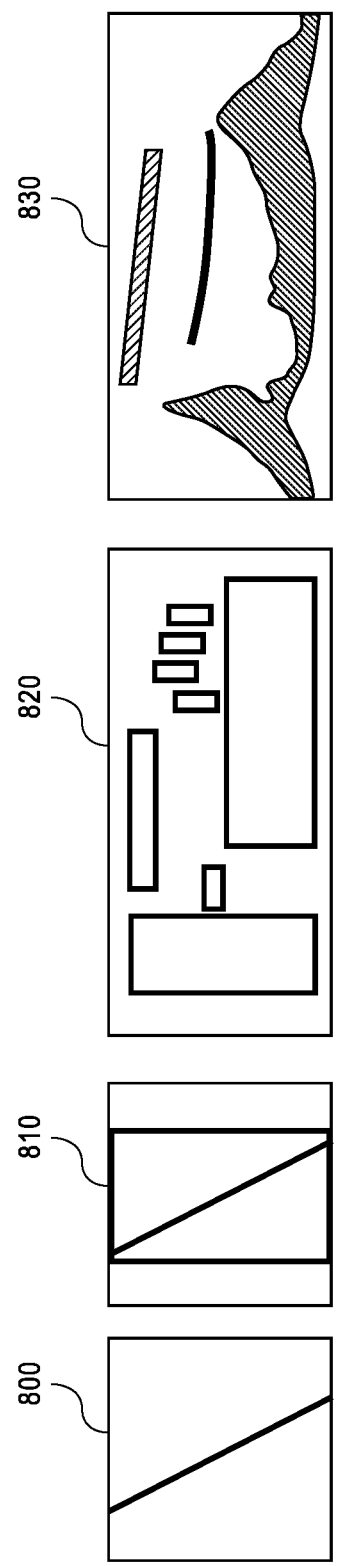
FIG. 8 illustrates examples of interpreted data that can be converted into machine learning training data sets, according to an embodiment.

FIG. 8 illustrates examples of interpreted data that can be converted into machine learning training data sets, according to an embodiment.

Subsection 800 can represent a subsection that is classified based on a geological structure within the subsection. For example, subsection 800 can include a fault, and interpreted data associated with subsection 800 can include an image of the subsection and metadata indicating that a fault is within the subjection. Accordingly, a label can be generated (e.g., a text label, a binary label, etc.) indicating that subsection 800 is associated with a fault.

Subsection 810 can represent a subsection that is classified based on a geological structure within the subsection, where the structure is also localized by a bounding box. For example, subsection 810 can include a fault, and interpreted data associated with subsection 810 can include an image of the subsection, metadata indicating that a fault is within the subsection, and/or metadata indicating xy coordinates of a bounding box surrounding the fault. Accordingly, a label can be generated indicating that subjection 810 is associated with a fault and coordinates of the bounding box.

Subsection 820 can represent a subsection that is associated with multiple detected objects within the subsection. For example, subsection 820 can include faults, salt bodies, and a horizon, and interpreted data associated with subsection 820 can include an image of the subsection and metadata indicating that faults, salt bodies, and a horizon are within the subsection. Accordingly, a label can be generated indicating that subjection 820 is associated with faults, salt bodies, and a horizon.

Subsection 830 can represent a subsection that is segmented based on multiple detected objects within the subsection. For example, subsection 830 can include faults, salt bodies, and a horizon, and interpreted data associated with subsection 820 can include an image of the subsection, metadata indicating that faults, salt bodies, and a horizon are within the subsection, and/or metadata indicating ranges of xy coordinates associated with the objects. Accordingly, a label can be generated indicating that subjection 820 is associated with faults, salt bodies, and a horizon, and indicating ranges of coordinates associated with the objects.

Figure 9:
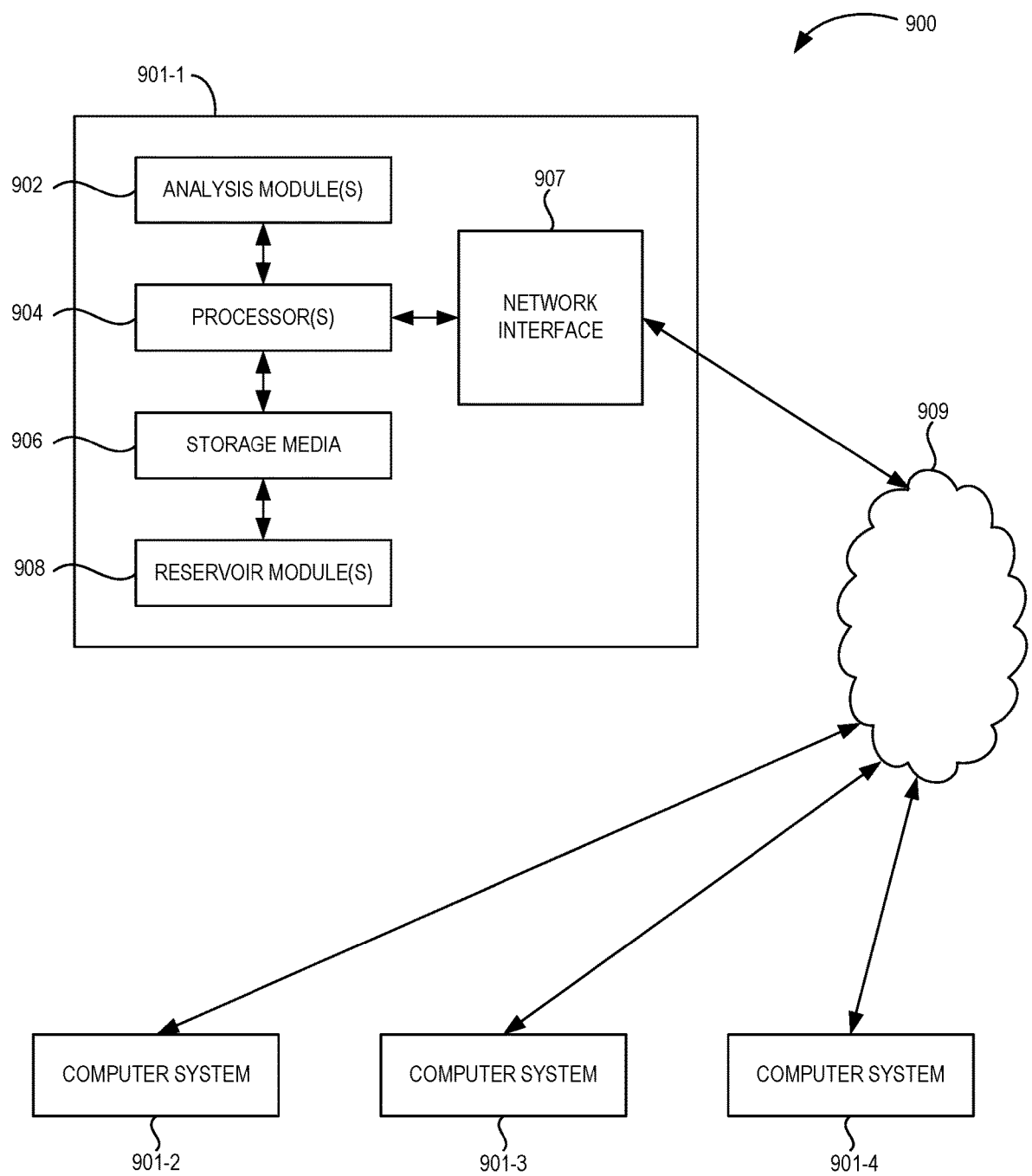
FIG. 9 illustrates an example computing system that may execute methods of the present disclosure, according to an embodiment.

In some embodiments, the methods of the present disclosure may be executed by a computing system. FIG. 9 illustrates an example of such a computing system 900, in accordance with some embodiments. The computing system 900 may include a computer or computer system 901-1, which may be an individual computer system 901-1 or an arrangement of distributed computer systems. The computer system 901-1 includes one or more analysis modules 902 that are configured to perform various tasks according to some embodiments, such as one or more methods disclosed herein. To perform these various tasks, the analysis module 902 executes independently, or in coordination with, one or more processors 904, which is (or are) connected to one or more storage media 906. The processor(s) 904 is (or are) also connected to a network interface 907 to allow the computer system 901-1 to communicate over a data network 909 with one or more additional computer systems and/or computing systems, such as 901-2, 901-3, and/or 901-4 (note that computer systems 901-2, 901-3, and/or 901-4 may or may not share the same architecture as computer system 901-1, and may be located in different physical locations, e.g., computer systems 901-1 and 901-2 may be located in a processing facility, while in communication with one or more computer systems such as 901-3 and/or 901-4 that are located in one or more data centers, and/or located in varying countries on different continents).

A processor may include a microprocessor, microcontroller, processor module or subsystem, programmable integrated circuit, programmable gate array, or another control or computing device.

The storage media 906 may be implemented as one or more computer-readable or machine-readable storage media. Note that while in the example embodiment of FIG. 9 storage media 906 is depicted as within computer system 901-1, in some embodiments, storage media 906 may be distributed within and/or across multiple internal and/or external enclosures of computing system 901-1 and/or additional computing systems. Storage media 906 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BL URA Y® disks, or other types of optical storage, or other types of storage devices. Note that the instructions discussed above may be provided on one computer-readable or machine-readable storage medium, or may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 900 contains reservoir module(s) 908 for creating workflows, displaying available commands, getting command statuses, executing commands, simulating user interface interactions, generating user interfaces, generating dialog boxes, etc. In the example of computing system 900, computer system 901-1 includes the reservoir module(s) 908. In some embodiments, a reservoir module may be used to perform aspects of one or more embodiments of the methods disclosed herein. In alternate embodiments, a plurality of reservoir modules may be used to perform aspects of methods disclosed herein.

It should be appreciated that computing system 900 is one example of a computing system, and that computing system 900 may have more or fewer components than shown, may combine additional components not depicted in the example embodiment of FIG. 9, and/or computing system 900 may have a different configuration or arrangement of the components depicted in FIG. 9. The various components shown in FIG. 9 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of protection of the disclosure.

Geologic interpretations, models, and/or other interpretation aids may be refined in an iterative fashion; this concept is applicable to the methods discussed herein. This may include use of feedback loops executed on an algorithmic basis, such as at a computing device (e.g., computing system 900, FIG. 9), and/or through manual control by a user who may make determinations regarding whether a given step, action, template, model, or set of curves has become sufficiently accurate for the evaluation of the subsurface three-dimensional geologic formation under consideration.

The foregoing description, for purpose of explanation, has been described with reference to specific embodiments. However, the illustrative discussions above are not intended to be exhaustive or limited to the precise forms disclosed. Many modifications and variations are possible in view of the above teachings. Moreover, the order in which the elements of the methods described herein are illustrated and described may be re-arranged, and/or two or more elements may occur simultaneously. The embodiments were chosen and described in order to explain principals of the disclosure and practical applications, to thereby enable others skilled in the art to utilize the disclosure and various embodiments with various modifications as are suited to the particular use contemplated.

What is claimed is:

1. A method, comprising:
   obtaining reservoir data from a storage medium, the reservoir data comprising seismic data unformatted for a machine learning model; and
   converting the reservoir data into a machine learning training data set by:
      segmenting, by a crawler application executed by a processor, at least a section of the reservoir data into a connected sequence of subsections; and
      labeling, by the crawler application, the connected sequence of subsections of the reservoir data to generate labeled reservoir data, wherein labeling comprises, for each subsection of the connected sequence of subsections:
         retrieving a portion of the reservoir data that is in the subsection,
         converting the portion of the reservoir data into an n-tuple, and
         labeling the subsection according to a type of the portion of the reservoir data.

2. The method of claim 1, wherein:
   the reservoir data comprises analysis data; and
   labeling the subsections of the reservoir data comprises labeling the subsections of the reservoir data based on the analysis data, the method further comprising performing quality control on the labeled reservoir data using at least one of input from an interpreter or a machine learning process.

3. The method of claim 2, wherein the analysis data is metadata incorporated with the reservoir data.

4. The method of claim 1, further comprising:
presenting visualizations of the subsections to an interpreter; and
receiving interpretive input corresponding to the subsections, wherein labeling the subsections of the reservoir data comprises labeling the subsections of the reservoir data based on the interpretive input.

5. The method of claim 1, further comprising:
feeding the labeled reservoir data into an artificial neural network; and
executing the artificial neural network as part of performing one or more of interpreting seismic data, interpreting geophysical data, interpreting reservoir data, performing well correlations, building reservoir models suitable for simulation, generating visualizations of simulation results, calculating volumes, producing maps, or designing development strategies to maximize reservoir exploitation.

6. The method of claim 1, wherein the reservoir data comprises one of a group consisting of:
a simulated reservoir model, and the subsections of the reservoir data comprise sequences of voxels of the simulated reservoir model;
a well log, and the subsections of the reservoir data comprise line segments corresponding to the well log;
an image, and the subsections of the reservoir data comprise rectangular subsections of the image; and
a reservoir model, and the subsections of the reservoir data comprise voxels of the reservoir model.

7. The method of claim 1, wherein the labeled reservoir data comprises at least one of text labels, binary labels, or n-tuple labels corresponding to the subsections.

8. The method of claim 1, wherein:
the reservoir data comprises a wireline of bulk density at depths beneath a surface,
segmenting comprises segmenting the wireline into an array of the connected sequence of subsections by bulk density and by depth,
labeling further comprises assigning binary values to a corresponding n-tuple assigned to each of the connected sequence of subsections, and
the binary values of the corresponding n-tuple define a range of bulk densities within a corresponding subsection in the connected sequence of subsections.

9. The method of claim 1, wherein:
the reservoir data comprises a wireline of bulk density at depths beneath a surface, segmenting comprises segmenting the wireline into an array of the connected sequence of subsections by bulk density and by depth, and
labeling further comprises:
assigning binary values to a corresponding n-tuple assigned to each of the connected sequence of subsections, the binary values of the corresponding n-tuple define a range of bulk densities within a corresponding subsection in the connected sequence of subsections, and
assigning a rock type to each of the connected sequence of subsections by comparing the corresponding n-tuple to known rock types by bulk density.

10. The method of claim 1, wherein:
the reservoir data comprises a f-k plot of frequency versus wave number taken by scanning a ground,
segmenting comprises segmenting the f-k plot into a connected sequence of images,
labeling further comprises assigning binary values to a corresponding array of the binary values associated with the connected sequence of images, and
the binary values label each of the connected sequence of images as containing wave energy data or containing no wave energy data.

11. The method of claim 1, wherein:
the reservoir data comprises a reservoir model comprising a plurality of data types within the reservoir model,
segmenting comprises segmenting the reservoir model into a sequence of connected voxels, and
labeling further comprises, for each voxel:
determining, by analyzing a subset of the plurality of data types within a voxel, a type of subterranean structure for the voxel, and
labeling the voxel with the type of subterranean structure for the voxel.

12. The method of claim 1, wherein:
the reservoir data comprises interpreted data,
identifying a bounding box within at least one of the connected sequence of subsections, and
labeling further comprises labeling the at least one of the connected sequence of subsections according to a structure defined within the bounding box.

13. The method of claim 1, further comprising:
feeding the machine learning training data set into an artificial neural network.

14. A computing system comprising:
one or more processors; and
a memory system comprising one or more non-transitory, computer-readable media storing instructions that, when executed by at least one of the one or more processors, cause the computing system to perform operations, the operations comprising:
obtaining reservoir data from a storage medium, the reservoir data comprising seismic data unformatted for a machine learning model; and
converting the reservoir data into a machine learning training data set by:
segmenting, by a crawler application executed by a processor, at least a section of the reservoir data into a connected sequence of subsections; and
labeling, by the crawler application, the connected sequence of subsections of the reservoir data to generate labeled reservoir data, wherein labeling comprises, for each subsection of the connected sequence of subsections:
retrieving a portion of the reservoir data that is in the subsection,
converting the portion of the reservoir data into an n-tuple, and
labeling the subsection according to a type of the portion of the reservoir data.

15. The computer system of claim 14, wherein:
the reservoir data comprises analysis data; and
labeling the subsections of the reservoir data comprises labeling the subsections of the reservoir data based on the analysis data, the operations further comprising performing quality control on the labeled reservoir data using at least one of input from an interpreter or a machine learning process.

16. The computer system of claim 14, the operations further comprising:
presenting visualizations of the subsections to an interpreter; and
receiving interpretive input corresponding to the subsections, wherein labeling the subsections of the reservoir data comprises labeling the subsections of the reservoir data based on the interpretive input.

17. The computer system of claim 14, the operations further comprising:
feeding the labeled reservoir data into an artificial neural network; and
executing the artificial neural network as part of performing one or more of interpreting seismic data, interpreting geophysical data, interpreting reservoir data, performing well correlations, building reservoir models suitable for simulation, generating visualizations of simulation results, calculating volumes, producing maps, or designing development strategies to maximize reservoir exploitation.

18. The computer system of claim 14, wherein the reservoir data comprises one of a group consisting of:
a simulated reservoir model, and the subsections of the reservoir data comprise sequences of voxels of the simulated reservoir model;
a well log, and the subsections of the reservoir data comprise line segments corresponding to the well log;
an image, and the subsections of the reservoir data comprise rectangular subsections of the image; and
a reservoir model, and the subsections of the reservoir data comprise voxels of the reservoir model.

19. The computer system of claim 14, wherein the labeled reservoir data comprises at least one of text labels, binary labels, or n-tuple labels corresponding to the subsections.

20. A non-transitory, computer-readable medium storing instructions that, when executed by one or more processors of a computing system, cause the computing system to perform operations, the operations comprising:
obtaining reservoir data from a storage medium, the reservoir data comprising seismic data unformatted for a machine learning model; and
converting the reservoir data into a machine learning training data set by:
segmenting, by a crawler application executed by a processor, at least a section of the reservoir data into a connected sequence of subsections; and
labeling, by the crawler application, the connected sequence of subsections of the reservoir data to generate labeled reservoir data, wherein labeling comprises, for each subsection of the connected sequence of subsections:
retrieving a portion of the reservoir data that is in the subsection,
converting the portion of the reservoir data into an n-tuple, and
labeling the subsection according to a type of the portion of the reservoir data.

\* \* \* \* \*